United States Patent
Xu (10) Patent No.: US 11,066,333 B2
(45) Date of Patent: Jul. 20, 2021

(54) CERAMIC COMPOSITE MATERIALS, ARTICLES, AND METHODS

(71) Applicant: The Florida State University Research Foundation, Inc., Tallahassee, FL (US)

(72) Inventor: Cheryl Xu, Cary, NC (US)

(73) Assignee: The Florida State University Research Foundation, Inc., Tallahassee, FL (US)

( * ) Notice: Subject to any disclaimer, the term of this patent is extended or adjusted under 35 U.S.C. 154(b) by 253 days.

(21) Appl. No.: 16/279,684

(22) Filed: Feb. 19, 2019

(65) Prior Publication Data
US 2019/0256426 A1   Aug. 22, 2019

Related U.S. Application Data

(60) Provisional application No. 62/632,062, filed on Feb. 19, 2018.

(51) Int. Cl.
| | |
|---|---|
| *C04B 35/571* | (2006.01) |
| *C04B 35/626* | (2006.01) |
| *C04B 35/645* | (2006.01) |
| *C04B 35/80* | (2006.01) |
| *H05K 9/00* | (2006.01) |
| *B64D 45/02* | (2006.01) |

(52) U.S. Cl.
CPC ............ *C04B 35/571* (2013.01); *B64D 45/02* (2013.01); *C04B 35/6261* (2013.01); *C04B 35/6269* (2013.01); *C04B 35/62695* (2013.01); *C04B 35/645* (2013.01); *C04B 35/806* (2013.01); *H05K 9/0081* (2013.01); *C04B 2235/3813* (2013.01); *C04B 2235/3826* (2013.01); *C04B 2235/483* (2013.01); *C04B 2235/5248* (2013.01); *C04B 2235/602* (2013.01); *C04B 2235/61* (2013.01); *C04B 2235/616* (2013.01); *C04B 2235/668* (2013.01); *C04B 2235/9607* (2013.01)

(58) Field of Classification Search
CPC ................................................... C04B 35/571
See application file for complete search history.

(56) References Cited

U.S. PATENT DOCUMENTS

| | | | |
|---|---|---|---|
| 10,584,070 B2 * | 3/2020 | Corman | ................ C04B 35/565 |
| 2018/0040387 A1 * | 2/2018 | Washington, II | ......... G21F 3/02 |

OTHER PUBLICATIONS

Zhou et al. "Hot Pressed $ZrB_2$—SiC—C ultra high temperature ceramics with polycarbosilane as a precursor" Materials Letters, 61, 2007, 960-963. (Year: 2007).*

Kroke et al., "Silazane Derived Ceramics and Related Mateirals," Materials Science and Engineering, 2000, 26:97-1999.

(Continued)

*Primary Examiner* — Peter F Godenschwager
(74) *Attorney, Agent, or Firm* — Eversheds Sutherland (US) LLP (57) ABSTRACT

Methods of forming composite materials, composite materials, and articles. The composite materials may include electromagnetic shielding materials. The methods may include providing a mixture of ultra-high temperature ceramic particles and a liquid preceramic precursor, curing the mixture to form a solid mixture, forming particles of the solid mixture, and pressing the particles into a mold.

15 Claims, 1 Drawing Sheet

(56) References Cited

OTHER PUBLICATIONS

Levine et al., "Evaluation of Ultra-High Temperature Ceramics for Aeropropulsion Use," Journal of the European Ceramic Society, 2002, 22:2757-2767.
Nakashima et al., "Conversion of a Precursor Derived from Cage-Type and Cyclic Molecular Building Blocks into Al—Si—N—C Ceramic Composites," J. Am. Ceram. Soc., 2002, 85(1):59-64.
Paciorek et al., "Reactions of Trist[bis(trimethylsilyl)amino]aluminum with Ammonia and Pyrolysis Studies," Chem. Mater., 1991, 3:82-87.
Rahman et al., "Electrical Resistivity of Titanium Diboride and Zirconium Diboride," J. Am. Ceram. Soc., 1995, 78(5) 1380-1382.
Sarkar et al., "Polymer-Derived Ceramic Composite Fibers with Aligned Pristine Multiwalled Carbon Nanotubes," Applied Materials & Interfaces, 2010, 2(4):1150-1156.
Shao et al., "Ceramic Nanocomposites Reinforced with a High Volume Fraction of Carbon Nanofibers," Materials Letters, 2012, 68:108-111.
Tang et al., "Ablation Behaviors of Ultra-High Temperature Ceramic Composites," Materials Science and Engineering A, 2007, 465:1-7.
Wang et al., "Evolution in the Electronic Structure of Polymer-Derived Amorphous Silicon Carbide," J. Am. Ceram. Soc., 2015, 98(7):2153-2158.
Zhang et al., "Thermal and Electrical Transport Properties of Spark Plasma-Sintered HfB2 and ZrB2 Ceramics," J. Am. Ceram. Soc., 2011, 94(8):2562-2570.

\* cited by examiner

CERAMIC COMPOSITE MATERIALS, ARTICLES, AND METHODS

CROSS-REFERENCE TO RELATED APPLICATIONS

This application claims priority to U.S. Provisional Patent Application No. 62/632,062, filed Feb. 19, 2018, which is incorporated herein by reference.

BACKGROUND

Electromagnetic (EM) shielding, in most instances, is provided by a material layer capable of attenuating the transmission of an EM wave into a bulk material that is protected by the material layer. Three different mechanisms, including reflection (R), absorption (A), and multiple internal reflections (M) may contribute to the overall attenuation.

The primary mechanism of EM shielding is typically the reflection from the shield surface, which usually requires the presence of enough mobile charge carriers (electrons or holes) in the shield material to interact with the electromagnetic (EM) wave, thereby causing ohmic losses and heating of the shield. This mechanism may occur when a shield material is electrically conducting. The second mechanism of EM shielding is absorption, which usually requires the shield material to include enough electric and/or magnetic dipoles to interact with the EM wave in the radiation. When the absorption mechanism is strong and the attenuation magnitude is greater than 10 dB, the multiple internal reflections (M) may become negligible (~1.0 dB) (see, e.g., Saini, P. et al., 2012, New Polymers for Special Applications, InTech).

Typical electromagnetic shielding materials include high concentrations of iron powders dispersed in a polymer matrix, and such materials are usually heavy, costly, or both. Carbon materials, such as carbon nanotubes (CNTs), carbon black, and graphite flakes, have also been considered for low temperature applications (e.g., applications at <500° C.), due at least in part to their electrical conductivity, their light weight, or a combination thereof. However, for higher temperature (e.g., >700° C.) and/or oxidizing environments, such as those environments encountered by airplane nozzle areas, traditional carbon/polymer matrix composites are not suitable.

Currently-available EM shielding materials include metal materials and polymer based composites. These materials, however, typically cannot be used at temperatures greater than 700° C., because such temperatures usually result in melting and/or decomposition.

For EM shielding components configured to be used in high temperature conditions (e.g., >700° C.), the high temperature electrical conductivity can be an important feature. Electrical conductivity tests have been performed at temperatures up to about 1,300° C., but such temperatures are still lower than the temperatures to which EM shielding components may be exposed in certain applications. Therefore, there remains a need for techniques and instruments for measuring electrical and/or dielectric properties at elevated temperatures, for example, up to 2,500° C.

Polymer-derived ceramics (PDCs) are a class of multifunctional ceramics, typically synthesized by a thermal decomposition of polymeric precursors (see, e.g., Kroke, E. et al., 2000, Materials Science and Engineering: R, 26, 97). Typical processing steps used to fabricate PDCs may include (i) the synthesis/modification of one or more polymeric precursors, (ii) the molding and solidification of the one or more polymeric precursors; and (iii) pyrolysis (e.g., 800° C. to 1,000° C.) of the precursors into ceramics.

Typically, the ceramics obtained are predominantly amorphous, and can be converted to polycrystalline ceramics with micro/nano or even nano/nano structures by annealing. Depending upon processing conditions and the choice of precursors, a wide range of ceramics in either amorphous or crystalline forms can be synthesized by PDC processing (see, e.g., Nakashima, H., et al., 2002, Journal of American Ceramic Society, 85, 59; and Paciorek, K. J. L. et al., 1991, Chemistry of Materials, 1, 82).

PDCs can possess a number of properties, including desirable high-temperature thermo-mechanical properties. For example, PDCs can be thermally stable and/or resistant to large-scale crystallization at temperatures up to 2,000° C. The creep resistance of PDCs, in some instances, can exceed that of polycrystalline SiC and $Si_3N_4$. The oxidation and corrosion resistances of PDCs may be about an order of magnitude greater than those of SiC and $Si_3N_4$. PDC processing also may offer one or more advantages over traditional ceramic processing, such as the ability to produce ceramic components having complex shapes.

Ceramic nanocomposites reinforced with carbon nanofibers (see, e.g., Shao, G. et al., 2012, Materials Letters, 68, 1940), or carbon nanotubes (see, e.g., Sarkar, S. et al., 2010, ACS Applied Materials & Interfaces, 2, 1150) have been manufactured. The manufacturing processes for making these materials can rely on a liquid precursor phase (e.g., by using a 3D printing technique or electrospray process) or a polymer phase (e.g., by using turning and milling processes, or a laser manufacturing process).

Currently available methods, however, typically do not provide suitable material systems having one or more properties that are desirable for use in certain environments, including harsh environments (e.g., high temperature environments, i.e., >700° C.). Desirable properties for materials that are suitable for use at high temperatures include, but are not limited to, [1] good oxidation resistance, [2] good electrical conductivity, [3] high magnetic permeability, or [4] a combination thereof.

Ultra-high temperature ceramics (UHTCs) generally have high melting points (i.e., ≥1,000° C.), and one or more desirable features, such as [1] the ability to retain one or more mechanical properties at high temperatures, [2] corrosion resistance, [3] and/or oxidation resistance, due, in some instances, to a refractory oxide on their surfaces. For example, $ZrB_2$ and $HfB_2$ can be used at temperatures of 1,900° C. to 2500° C. (see, e.g., Bull, J. D. et al., 1992, 24th International SAMPE Technical Conference, Toronto, Canada, T1092).

UHTCs have been used to make composite materials, including UHTC/SiC composites (see, e.g., Levine, S. R. et al., 2002, Journal of the European Ceramic Society, 22, 2757; Monteverde, F. et al., 2008, Materials Science and Engineering A, 485, 415; Zimmermann, J. W. et al., 2008, Journal of American Ceramic Society, 91, 1405; and Guo, S. et al., 2007, Journal of American Ceramic Society, 90, 2255).

UHTCs have been typically prepared by hot press, e.g., at 1900° C. and 21 MPa in argon for 1 hour (see, e.g., Rahman, M. et al., 1995, Journal of the American Ceramic Society, 78, 1380). Although the electrical resistivity of UHTCs has been reported to increase with elevated temperature, few, if any, temperatures, exceeding 1,300° C. have been tested (Id.).

Elemental powders, such as Hf, Zr, or B, have been used as precursors for making UHTCs. In such methods, the elemental powders typically are mixed with SiC powders, the powder mixture is compacted into billets, and then the billets are consolidated by spark plasma sintering (see, e.g., Zhang, L. et al., 2011, Journal of American Ceramic Society, 94, 2562).

For fiber reinforced UHTC composites, a powder infiltration method also has been used. In these methods, UHTC powders are dispersed into distilled water, and then the suspension is infiltrated into the fiber preform. The water typically is squeezed out of the preform, while the powders remain trapped in the preform. The infiltrated part is then dried and sintered by a pressure-less or hot press method (see, e.g., Tang, S. et al., 2007, Materials Science and Engineering A, 465, 1).

UHTCs, however, usually suffer from one or more disadvantages, such as low fracture toughness, poor thermal shock resistance, and/or poor sinterability.

There remains a need for materials that do not suffer from one or more of the foregoing disadvantages, including materials having a relatively high electrical conductivity (e.g., at least about $10^6$ S/cm), which can be desirable for electromagnetic shielding (EM) shielding applications. There also remains a need for improved EM shielding materials, including materials that [1] may be used for high temperature applications in oxidizing environments, [2] are electrically conductive, [3] have high permeability, and/or [4] have a thickness effective to ensure a desired EM shielding performance at a particular frequency range.

BRIEF SUMMARY

Provided herein are composite materials, embodiments of which are stable at high temperatures (e.g., >700° C.), in oxidizing environments, at high pressures, or a combination thereof. In some embodiments, the composite materials are suitable for electromagnetic shielding applications, including electromagnetic shielding applications at high temperatures (e.g., >700° C.), in oxidizing environments, or a combination thereof. Also provided herein are methods of making composite materials, including conductive ceramic composite materials that may have a desirable permeability, thickness, or a combination thereof.

In one aspect, methods of forming a composite material are provided. In some embodiments, the methods include providing a mixture that includes (i) ultra-high temperature ceramic particles and (ii) a liquid preceramic precursor; heating the mixture at a temperature for a time effective to cure the liquid preceramic precursor to form a solid mixture; subjecting the solid mixture to one or more forces to form particles of the solid mixture; and pressing the particles of the solid mixture into a mold having a pre-selected shape to form the composite material. In some embodiments, the methods also include sintering the composite material.

In another aspect, composite materials are provided. The composite materials may include ultra-high temperature ceramic particles and a polymer-derived ceramic.

In yet another aspect, articles are provided. In some embodiments, the articles include one or more surfaces, and a composite material described herein is arranged on the one or more surfaces. The articles may include those that may be exposed to extreme and/or harsh environments. For example, the articles may include a nosecone of an aircraft of a part thereof.

Additional aspects will be set forth in part in the description which follows, and in part will be obvious from the description, or may be learned by practice of the aspects described below. The advantages described below will be realized and attained by means of the elements and combinations particularly pointed out in the appended claims. It is to be understood that both the foregoing general description and the following detailed description are exemplary and explanatory only and are not restrictive.

DETAILED DESCRIPTION

Provided herein are methods of making composite materials, that, in some embodiments, can improve the sintering ability of UHTCs, and/or eliminate the need for an additional sintering aid.

The methods described herein can produce composite materials that may be capable of improving EM shielding performance in extreme environments, such as at high temperatures (e.g., >700° C.) and/or corrosive conditions. Not wishing to be bound by any particular theory, it is believed that the employment of UHTC and PDC materials in embodiments herein can provide ceramic, but conductive, composites, which can be suitable for high temperature conductive applications.

Not wishing to be bound by any particular theory, it is believed that composite materials that include a high conductive reinforcement can exhibit improved EM shielding effectiveness. For example, it is believed that the use of UHTC as a conductive reinforcement, and a PDC as a matrix can, in some embodiments, produce ceramic matrix composite materials that are suitable for EM shielding.

Also provided herein are systems for conducting high temperature (>1500° C.) electrical conductivity measurements. In some embodiments, a vector network analyzer is integrated into the systems to characterize the dielectric and magnetic properties in a contactless manner.

Not wishing to be bound by any particular theory, it is believed that theoretical and experimental analysis can be done to determine one or more ways of modulating an EM shielding effect by modifying the microstructure, composition, and/or volume fraction of one or more both components in the mixtures and/or composite materials described herein.

Methods

In some embodiments, the methods herein include providing a mixture that includes (i) ultra-high temperature ceramic particles and (ii) a liquid preceramic precursor.

The weight percentage of the ultra-high temperature ceramic particles in the mixture may be about 0.1 to about 50%, about 10% to about 50%, about 20% to about 50%, or about 30% to about 50%, based on the weight of the mixture.

In some embodiments, the weight ratio of the ultra-high temperature ceramic particles to the liquid preceramic precursor in the mixture is about 0.5-1.5:1, or about 0.1-1:1.

In some embodiments, the ultra-high temperature ceramic particles are dispersed substantially evenly in the liquid preceramic precursor.

In some embodiments, the providing of the mixture that includes ultra-high temperature ceramic particles and a liquid preceramic precursor includes stirring the ultra-high temperature ceramic particles and the liquid preceramic precursor, sonicating the ultra-high temperature ceramic particles and the liquid preceramic precursor, or a combination thereof.

In some embodiments, the methods include heating the mixture that includes ultra-high temperature ceramic particles and a liquid preceramic precursor. The heating of the mixture may occur at a temperature for a time effective to cure the liquid preceramic precursor to form a solid mixture. The temperature may be effective to convert a liquid preceramic precursor to a ceramic. The temperature and time effective to cure the liquid preceramic precursor may be selected based on the properties of the liquid preceramic precursor. In some embodiments, the temperature is about 150° C. to about 400° C., about 150° C. to about 350° C., or about 200° C. to about 300° C. The time may be about 1 minute to about 6 hours, or longer. In some embodiments, the curing of the liquid preceramic precursor includes at least partially crosslinking the liquid preceramic precursor.

In some embodiments, the methods include subjecting the solid mixture to one or more forces to form particles of the solid mixture. The one or more forces may include any force effective to reduce the solid mixture to particles of any size. In some embodiments, the subjecting of the solid mixture to one or more forces includes grinding the solid mixture, compressing (e.g., crushing) the solid mixture, or a combination thereof. In some embodiments, the grinding of the solid mixture includes ball milling the solid mixture.

In some embodiments, each of the particles of the solid mixture includes (a) a core region that includes an amount of the ultra-high temperature ceramic particles, and (b) a surface region that includes an amount of the cured liquid preceramic precursor. For each of the particles (i) the amount of the ultra-high temperature ceramic particles of the core region may include at least 75%, by weight of the ultra-high temperature ceramic particles that are present in each particle, and (ii) the amount of the cured liquid preceramic precursor of the surface region may include at least 75%, by weight, of the cured ceramic precursor that is present in each particle. For each of the particles (i) the amount of the ultra-high temperature ceramic particles of the core region may include at least 80%, by weight of the ultra-high temperature ceramic particles that are present in each particle, and (ii) the amount of the cured liquid preceramic precursor of the surface region may include at least 80%, by weight, of the cured ceramic precursor that is present in each particle. For each of the particles (i) the amount of the ultra-high temperature ceramic particles of the core region may include at least 90%, by weight of the ultra-high temperature ceramic particles that are present in each particle, and (ii) the amount of the cured liquid preceramic precursor of the surface region may include at least 90%, by weight, of the cured ceramic precursor that is present in each particle. For each of the particles (i) the amount of the ultra-high temperature ceramic particles of the core region may include at least 95%, by weight of the ultra-high temperature ceramic particles that are present in each particle, and (ii) the amount of the cured liquid preceramic precursor of the surface region may include at least 95%, by weight, of the cured ceramic precursor that is present in each particle. When the ultra-high temperature ceramic particles are microparticles, a single particle may be present in a core region, or a plurality of particles may be present in a core region. When the ultra-high temperature ceramic particles are nanoparticles, a plurality of particles may be present in a core region.

Figure 1:
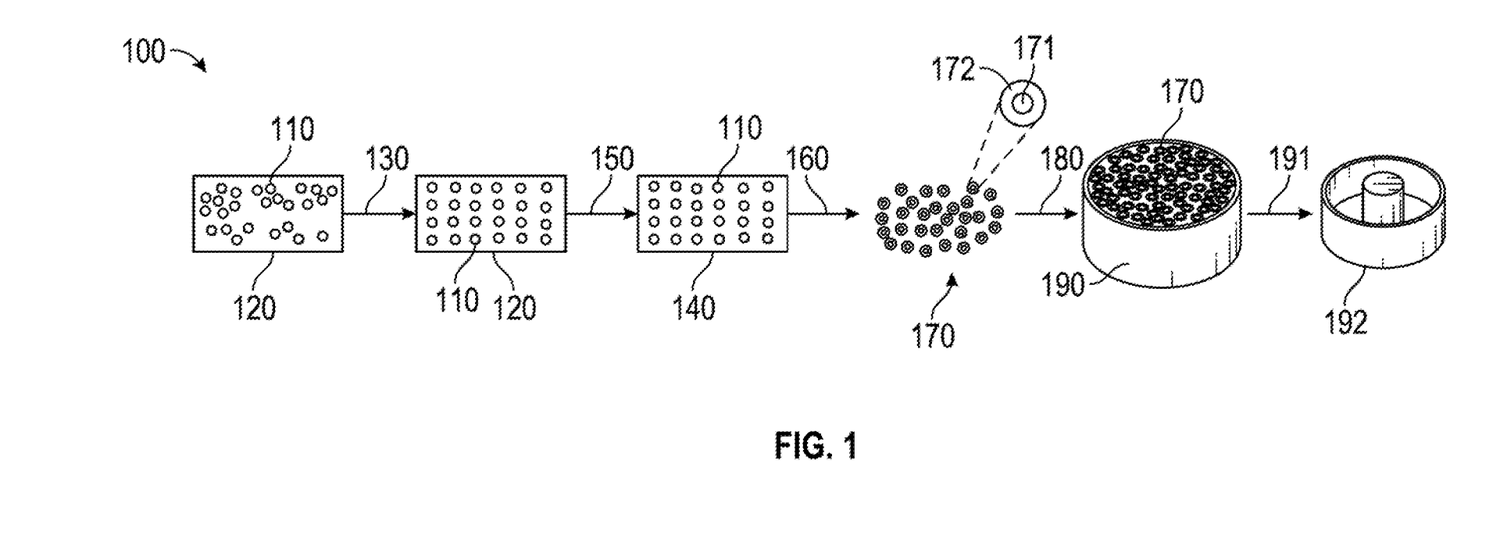
FIG. 1 depicts a schematic of one embodiment of a method described herein.

In some embodiments, the methods include pressing the particles of the solid mixture into a mold having a pre-selected shape to form the composite material. In some embodiments, the pressing of the particles of the cured mixture includes disposing the particles in a cold press or hot press. The mold generally may have any pre-selected shape. For example, the mold, as depicted at FIG. 1, may have a pre-selected shape that results in composite material shaped like a dish having a substantially raised center portion. The mold may be configured to produce a solid composite material (e.g., a film, a sphere, a rectangle, etc.) or a composite material having one of more passages that partially or completely traverse the composite material.

In some embodiments, the methods include sintering the composite material. The sintering generally may include heating the particles of the solid mixture that are in the mold to a temperature for a time effective to coalesce into a solid or porous mass. In some embodiments, the temperature and time is effective to convert a liquid preceramic precursor to a ceramic. In some embodiments, the composite material is removed from a mold prior to sintering. In some embodiments, the composite material is sintered while the composite material is in the mold.

FIG. 1 depicts a schematic of one embodiment of the methods described herein. In the method 100 of FIG. 1, a desired volume fraction of UHTC particles 110 and a liquid PDC precursor 120 are combined to form a mixture, and then the mixture is stirred 130 to evenly disperse the UHTC particles 110 in the liquid PDC precursor 120. The mixture is then cured 150 to convert the liquid PDC precursor 120 to a solid mixture 140. The solid mixture 140 is then crushed and milled 160 to form particles of the solid mixture 170. The particles of the solid mixture 170, as depicted at the inset, have a core region 171 of UHTC particles 110 and a surface region 172 of cured PDC precursor. The particles of the solid mixture 170 are pressed 180 into a mold 190 having a desired shape to form a composite material, which is then sintered 191 (before or after being removed from the mold 190) to form a composite material product 192.

Ultra-High Temperature Ceramic Particles

As used herein, the phrase ultra-high temperature ceramic particles (UHTCs) generally refers to ceramic particles having a melting temperature of at least 1,500° C. In some embodiments, the ultra-high temperature ceramic particles have a melting temperature of at least 1,750° C. In some embodiments, the ultra-high temperature ceramic particles have a melting temperature of at least 2,000° C. In some embodiments, the ultra-high temperature ceramic particles have a melting temperature of at least 2,250° C. In some embodiments, the ultra-high temperature ceramic particles have a melting temperature of at least 2,500° C. In some embodiments, the ultra-high temperature ceramic particles have a melting temperature of at least 2,750° C. In some embodiments, the ultra-high temperature ceramic particles have a melting temperature of at least 3,000° C.

In some embodiments, the ultra-high temperature ceramic particles have an elastic modulus of at least 400 GPa. In some embodiments, the ultra-high temperature ceramic particles have an elastic modulus of at least 500 GPa. In some embodiments, the ultra-high temperature ceramic particles have an elastic modulus of at least 600 GPa. In some embodiments, the ultra-high temperature ceramic particles have an elastic modulus of at least 700 GPa. In some embodiments, the ultra-high temperature ceramic particles have an elastic modulus of at least 800 GPa.

In some embodiments, the ultra-high temperature ceramic particles have a hardness of at least 15 GPa. In some embodiments, the ultra-high temperature ceramic particles have a hardness of at least 20 GPa. In some embodiments, the ultra-high temperature ceramic particles have a hardness of at least 25 GPa. In some embodiments, the ultra-high temperature ceramic particles have a hardness of at least 30 GPa.

In some embodiments, the ultra-high temperature ceramic particles have an electrical conductivity of at least $10^7$ S/m.

In some embodiments, the ultra-high temperature ceramic particles have a thermal conductivity of about 60 to about 120 W/m*K. In some embodiments, the ultra-high temperature ceramic particles have a thermal conductivity of about 70 to about 120 W/m*K. In some embodiments, the ultra-high temperature ceramic particles have a thermal conductivity of about 80 to about 120 W/m*K. In some embodiments, the ultra-high temperature ceramic particles have a thermal conductivity of about 90 to about 120 W/m*K. In some embodiments, the ultra-high temperature ceramic particles have a thermal conductivity of about 100 to about 120 W/m*K.

In some embodiments, the ultra-high temperature ceramic particles have at least one of the following properties: [1] an elastic modulus of at least 500 GPa, [2] a hardness of at least 20 GPa, [3] an electrical conductivity of at least $10^7$ S/m, or [4] a thermal conductivity of about 60 to about 120 W/m*K. In some embodiments, the ultra-high temperature ceramic particles have each of the following properties: [1] an elastic modulus of at least 500 GPa, [2] a hardness of at least 20 GPa, [3] an electrical conductivity of at least $10^7$ S/m, or [4] a thermal conductivity of about 60 to about 120 W/m*K.

The ultra-high temperature ceramic particles generally may be of any average size. In some embodiments, the ultra-high temperature ceramic particles are microparticles. For example, the ultra-high temperature ceramic particles may have an average largest dimension (as determined by X-ray diffraction) of about 1 μm to about 999 μm, or about 1 μm to about 500 μm. In some embodiments, the ultra-high temperature ceramic particles are nanoparticles. For example, the ultra-high temperature ceramic particles may have an average largest dimension (as determined by X-ray diffraction) of about 1 nm to about 999 nm, or about 10 nm to about 500 nm.

Generally, any known ultra-high temperature ceramic particles may be used in the methods and composite materials herein. In some embodiments, the ultra-high temperature ceramic particles are selected from the group consisting of a boride, a carbide, and a nitride. In some embodiments, the ultra-high temperature ceramic particles include $HfB_2$, $ZrB_2$, $TiB_2$, $NbB_2$, $TaB_2$, or a combination thereof. In some embodiments, the ultra-high temperature ceramic particles include TaC, HfC, ZrC, NbC, TiC, or a combination thereof. In some embodiments, the ultra-high temperature ceramic particles include TaN, HfN, TiN, ZrN, NbN, or a combination thereof. In some embodiments, the ultra-high temperature ceramic particles include $HfB_2$, $ZrB_2$, $TiB_2$, $NbB_2$, $TaB_2$, TaC, HfC, ZrC, NbC, TiC, TaN, HfN, TiN, ZrN, NbN, or a combination thereof.

In some embodiments, the UHTC is $ZrB_2$. In some embodiments, the UHTC is $TiB_2$. In some embodiments, the UHTC is $HfB_2$. In some embodiments, the UHTC includes $ZrB_2$ and $TiB_2$. Several properties of $HfB_2$, $TiB_2$, and $ZrB_2$ are provided at the following tables:

TABLE 1

Selected Properties of $TiB_2$ and $ZrB_2$

| Property | $TiB_2$ | $ZrB_2$ |
|---|---|---|
| Melting point (° C.) | 3225 ± 20 | 3245 ± 18 |
| Density (g/cm³) | 4.52 | 6.10 |

TABLE 1-continued

Selected Properties of $TiB_2$ and $ZrB_2$

| Property | $TiB_2$ | $ZrB_2$ |
|---|---|---|
| Crystal structure | Hexagonal | Hexagonal |
| Electrical resistivity at 20° C. (μΩ * cm) | 28.4 | 9.2 |

TABLE 2

Selected Properties of $ZrB_2$ and $HfB_2$

| Property | $ZrB_2$ | $HfB_2$ |
|---|---|---|
| Crystal system space group | Hexagonal | Hexagonal |
| Prototype structure | P6/mmm $AlB_2$ | P6/mmm $AlB_2$ |
| a (Å) | 3.17 | 3.139 |
| c (Å) | 3.53 | 3.473 |
| Density (g/cm³) | 6.119 | 11.212 |
| Melting temperature (° C.) | 3245 | 3380 |
| Young's modulus (GPa) | 489 | 480 |
| Bulk modulus (GPa) | 215 | 212 |
| Hardness (GPa) | 23 | 28 |
| Coefficient of thermal expansion ($K^{-1}$) | $5.9 \times 10^{-6}$ | $6.3 \times 10^{-6}$ |
| Heat capacity at 25° C. (J (mol K)$^{-1}$) | 48.2 | 49.5 |
| Electrical conductivity (S/cm) | $1.0 \times 10^7$ | $9.1 \times 10^6$ |
| Thermal conductivity (W (m K)$^{-1}$) | 60 | 104 |
| Enthalpy of formation at 25° C. (kJ) | −322.6 | −358.1 |
| Free energy of formation at 25° C. (kJ) | −318.2 | −332.2 |

In some embodiments, $ZrB_2$ is selected as the UHTC particle, and may serve as a reinforcement in the composite materials. The oxidation of $ZrB_2$ begins at relatively low temperatures (e.g., about 400° C. to about 500° C.) with the formation of $ZrO_2$ and/or $B_2O_3$. If a surface layer of boron oxide is sufficiently fluid, then it can coat a majority of the material's surface, and possibly act as an effective diffusion barrier for oxygen. At higher temperatures, however, boron oxide can begin to evaporate, which can result in a loss of the oxygen barrier layer. Not wishing to be bound by any particular theory, it is believed that the incorporation of SiC can lessen or avoid this problem.

Liquid Preceramic Precursor

Generally, any known liquid preceramic precursor may be used in the methods and composite materials described herein. As used herein, the phrase "liquid preceramic precursor" generally includes any material that may be converted to a ceramic upon heating.

In some embodiments, the liquid preceramic precursor includes a polymer. Therefore, in some embodiments, a matrix of the composite materials provided herein includes a polymer-derived ceramic (PDC). The phrase "polymer-derived ceramic" (i.e., "PDC"), as used herein, refers to a ceramic material formed via the thermal decomposition of a polymeric precursor. The PDC may be created by the thermal decomposition of polymeric liquid preceramic precursor, instead of sintering ceramic powder compacts.

In some embodiments, the polymer includes an organosilicon polymer. The organosilicon polymer may be selected from a polysiloxane, a polysilsesquioxane, a polycarbosiloxane, a polycarbosilane, a polysilylcarbodiimide, a polysilsesquicarbodiimide, a polysilsesquiazane, a polysilazane, a polyborosilazane, a polyborosilane, a polyborosiloxane, or a combination thereof. In some embodiments, the polymer includes polycarbosilane.

In some embodiments, SiC is the PDC material of the composite materials described herein. SiC can have one or more desirable properties such as low density, good oxidation resistance, thermal chemical corrosion resistance, and/or high thermal shock resistance. In some embodiments, the PDC material of the composite materials described herein includes $Si_3N_4$, SiC, BN, AlN, SiCN, SiCO, BCN, SiCNO, SiBCN, SiBCO, SiAlCN, SiAlCO, or a combination thereof. Therefore, any liquid preceramic precursor that is capable of forming these ceramics upon sintering may be used in the methods described herein.

Composite Materials and Articles

Composite materials are provided, including composite materials made according to the methods described herein. In some embodiments, the composite materials are electromagnetic shielding materials. The electromagnetic shielding materials may substantially maintain their effectiveness at temperatures of at least 700° C., at least 800° C., at least 900° C., at least 1,000° C., or at least 1,500° C.

The composite materials herein generally may have any shape. The composite materials, for example, may be in the shape of a film, a solid object (e.g., a square, sphere, rectangle, etc.), a hollow object, etc.

Also provided herein are articles. The articles may have one or more surfaces, and a composite material as described herein may be arranged on one or more surfaces of the article. The composite material may be detachably or permanently affixed to the one or more surfaces of an article. In some embodiments, the composite material is an electromagnetic shielding material. In some embodiments, the article includes a portion of an aircraft (e.g., a nosecone). In some embodiments, the article includes a portion of a submarine.

Not wishing to be bound by any particular theory, it is believed that, at least in some embodiments, the composite materials described herein provide EM shielding via an absorption mechanism. Therefore, in some embodiments, the UHTCs-PDC functional ceramic composite materials described herein can be used at higher temperatures and/or harsher environments than known EM shielding materials. This feature may permit the composite materials described herein to be applied to an airplane nosecone to provide enhanced strength and/or durability.

In the descriptions provided herein, the terms "includes," "is," "containing," "having," and "comprises" are used in an open-ended fashion, and thus should be interpreted to mean "including, but not limited to." When composite materials, articles, or methods are claimed or described in terms of "comprising" various components or processing features, the composite materials, articles, and methods can also "consist essentially of" or "consist of" the various components or processing features, unless stated otherwise.

The terms "a," "an," and "the" are intended to include plural alternatives, e.g., at least one. For instance, the disclosure of "UHTC particles," "a liquid preceramic precursor," and the like, is meant to encompass one, or mixtures or combinations of more than one type of UHTC particles, liquid preceramic precursor, and the like, unless otherwise specified.

The processes described herein may be carried out or performed in any suitable order as desired in various implementations. Additionally, in certain implementations, at least a portion of the processes may be carried out in parallel. Furthermore, in certain implementations, less than or more than the processes described may be performed.

Many modifications and other implementations of the disclosure set forth herein will be apparent having the benefit of the teachings presented in the foregoing descriptions and the associated drawings. Therefore, it is to be understood that the disclosure is not to be limited to the specific implementations disclosed and that modifications and other implementations are intended to be included within the scope of the appended claims.

EXAMPLES

The present invention is further illustrated by the following examples, which are not to be construed in any way as imposing limitations upon the scope thereof. On the contrary, it is to be clearly understood that resort may be had to various other aspects, embodiments, modifications, and equivalents thereof which, after reading the description herein, may suggest themselves to one of ordinary skill in the art without departing from the spirit of the present invention or the scope of the appended claims. Thus, other aspects of this invention will be apparent to those skilled in the art from consideration of the specification and practice of the invention disclosed herein.

Example 1—Electromagnetic Properties of SiC

The SiC used in this example was derived from a liquid polycarbosilane (PCS) precursor. The as-received PCS was first cross-linked at 400° C. in argon. The cross-linked product was then pyrolyzed at 1,000° C. to obtain an amorphous silicon carbide, likely having the following chemical formula: $SiC_{1.45}O_{0.08}$.

The carbon content in this material was higher than the required amount to form stoichiometric silicon carbide, which indicated the existence of free carbon. Free carbon may contribute significantly to electrical conductivity.

The tests of this example revealed that the structure and one or more properties of the material changed, in some instances significantly, and the change was related to the selected synthesis temperature, likely due to the amorphous nature. The distribution and microstructure of free carbon, therefore, also appeared to depend, at least in part, on the pyrolysis temperature.

Plots of electrical conductivity as a function of testing temperature were collected for the SiC synthesized at different pyrolysis temperatures.

The conductivity increased as the pyrolysis temperature increased, which was consistent with the relevant literature (see, e.g., Wang K. et al., 2015, Journal of American Ceramics Society, 98, 2153). The conductivity change amplitude, however, decreased as the testing temperature decreased. This could have been due to the fact that higher pyrolysis temperatures can decrease the band gap, due, at least in part, to the release of hydrogen, thereby changing the electronic structure with the changing degree of order of the amorphous network (Id.).

Example 2—Preparation of Conductive Ceramics Composites Made with UHTCs and PDCs Commercial UHTC powders and polycarbosilane (PCS) are used as the starting materials of this example.

PCS is the preceramic precursor for SiC which is in a liquid polymer state. PCS precursor provides flexible manufacturing.

In this example, the UHTC powders are dispersed into PCS using magnetic stirring or sonication treatment.

Then, the mixture is cured under heat treatment in an oven. The cured bulk mixture is crushed to produce particles. Ball milling also can be used to decrease the size of the particles.

The resulting particles are compacted into pellets using a cold or hot press to achieve a preform of a desired shape. Then, the preform is hot pressed or subjected to pressureless sintering in an inert environment. In this process, the crushed powders had a core-shell structure in which the outer shell was PDC while the core included UHTC.

This structure can be beneficial for sintering, because PDC may improve the sintering of UHTC powders, thereby achieving a higher density in the material.

A polymer-derived ceramic (PDC) precursor can provide flexible manufacturing options. For example, ceramic nanocomposites reinforced with carbon nanofibers may be fabricated.

To fabricate a flexible ceramic film, a selected liquid PDC precursor or a mixture that includes a liquid preceramic precursor and a UHTC is vacuum-infiltrated into a sheet that included carbon nanotubes. The flexible ceramic composites are obtained after pyrolysis. At elevated temperatures, the cured polymer decomposes into an amorphous covalent ceramic material. Depending upon processing conditions and the choice of precursor, a wide range of ceramics in either amorphous or crystalline forms can be synthesized.

The nanocomposite microstructures, strengthening mechanism, or one or more other features are measured using scanning electron microscopy (SEM) and/or transmission electron microscopy (TEM). The nature of the interfaces between UHTC reinforcement and PDC matrix can be characterized. As part of an examination of the mechanical behavior that may be responsible, at least in part, for load transfer and/or toughness, the level of debonding can be measured.

Interaction between UHTCs powder and the PDC matrix at the interface is determined. A degree of chemical reaction and/or mass diffusion between the two phases may be present, and both are more likely to occur if high processing and application temperatures are used. SEM EDAX elemental mapping on polished cross-sections are used to evaluate mass diffusion at the interface. XRD of the cross-section is used to identify any new phase/material formed if the interfacial reaction is extensive.

A material's porosity may have an effect on electromagnetic wave absorbing properties. Therefore, the complex permittivity and electromagnetic attenuation value of the composites of this example are measured using an impedance/gain phase analyzer and a network analyzer in the frequency range of about 1 MHz to about 26 GHz. The relationship between the real part (and the imaginary part) of permittivity with the composite porosity is measured over the span of frequency range.

Example 3—Engineering UHTC-PDC Composites with Desired Electromagnetic Performance High performance ceramic composites are made from UTHC-PDCs. Knowledge of the electromagnetic behaviors of the UHTC phase and PDC phase are used to engineer UHTC-PDC composites with desirable electromagnetic performance.

The design of EM shielding materials incorporates a balanced combination of electrical conductivity ($\sigma$), dielectric permittivity, magnetic permeability ($\mu$) and physical geometry.

Experimentally, the shielding efficiency is generally assessed in terms of reduction in magnitude of incident power upon transition across the shield. EM shielding is measured using instruments called vector network analyzer (VNA). By VNA, the incident and transmitted waves are described by complex scattering parameters (or S-parameters) mathematically (see, e.g., Saini, P. et al., 2012, New Polymers for Special Applications, InTech; and Li, X. et al., Journal of the American Ceramic Society, 95, 1038). For example, the reflectance (R) and transmittance (T) is described by the following equations:

$$R = |S_{11}|^2 = |S_{22}|^2$$

$$T = |S_{12}|^2 = |S_{21}|^2$$

The shielding property is assessed by shielding effectiveness (SE) which is a combination of surface reflection ($SE_R$) and internal absorption ($SE_A$). $SE_R$ and $SE_A$ is achieved by the following equations:

$$SE_R = 10\log_{10}(1-R)$$

$$SE_A = 10\log_{10}\left[\frac{T}{(1-R)}\right]$$

wherein R and T are the reflectance and transmittance, respectively.

To elaborate the influences of material properties, the foregoing parameters also are expressed by the following equations:

$$SE_R = 39.5 + 10\log_{10}\left[\frac{\sigma}{(2\pi f \mu)}\right]$$

$$SE_A = 8.7 d \sqrt{\pi f \mu \sigma}$$

wherein f is the frequency of the EM wave, $\mu$ is the magnetic permeability, d is the specimen thickness and $\sigma$ is the electrical conductivity.

$SE_A$ is proportional to the square root of the product of the conductivity ($\sigma$) and permeability ($\mu$) of the shield material. Therefore, a good absorbing material can possess high conductivity and high permeability, and sufficient thickness to achieve the required EM shielding effectiveness.

$SE_A$ is in direct proportion to specimen thickness and the square root of the product of magnetic permeability and electrical conductivity. Changes of electrical conductivity, surface reflection shielding effectiveness $SE_R$ and internal absorption shielding effectiveness $SE_A$ of UHTCs-PDCs with different composition ratios and sample thicknesses are studied using the techniques described in the examples herein.

Example 4—Techniques and Equipment

The following techniques are used to test and/or characterize the materials herein. The objective of these techniques includes conducting a series of electromagnetic properties studies on embodiments of the conductive ceramic composites provided herein. The tests, in part, can determine how (1) the ceramics' processing temperature and (2) application temperature may affect the resulting composites' electromagnetic properties.

The electromagnetic properties of ceramic materials at high temperatures are measured (up to 3000° C.), including the material's temperature-dependent and composition-dependent properties. A high temperature furnace is operated in inert or vacuum atmosphere. The maximum temperature of the furnace is 3000° C. in argon (or 2200° C. in 0.01 Torr vacuum). The working zone is 89 mm in diameter and 152 mm high, with a temperature uniformity of +/−10° C. Both graphite and tungsten hot zones are available. The power supply is designed to accommodate a ramp rate of 100° C./minute. A complete water distribution system is employed to control the temperature of the furnace bodied shell. A ⅝" diameter rotatable gas-ported quartz sight window is located on the front of the chamber.

DC electrical conductivity is measured using a four-point probe method. This method measures electrical impedance using separate pairs of current-carrying and voltage-sensing electrodes, enabling more accurate measurements than the traditional two-terminal sensing method. It is also known as Kelvin sensing, and eliminates the lead contact resistance from the measurement.

The materials for the wires and the probes (both input and output) are a refractory metal/alloy that does not react with the sample at testing temperatures. Tungsten wire is used in this example due to its relative inertness toward ceramics (carbides and/or carbon containing ceramics). It has the highest melting point of any metal and tungsten's electrical conductivity is on the same order as copper (resistivity at 20° C. is $5.6*10^{-8}$ Ω.m).

In the test of this example, a voltage regulator is connected to two carbon felt tips, each having a finite radius. The carbon felts are placed at both ends of the test sample to provide cushion and minimize sample damage during probing. A current source is used to supply DC current through the outer two probes, while a voltmeter measures the voltage across the inner two probes to determine the sample resistivity. The input current for the four-point probe setup is very low (in mA), therefore the heating of the carbon felt probes and tungsten wire may be minimal.

In the system setup of this example, tungsten wires are shielded by Zirconia sleeves for electrical insulation. Twisting the tungsten pair wires for voltage measurement can reduce system noise, especially noise caused by the magnetic field effect. The test sample is held by a bench vise made of tungsten, in order to withstand high temperatures.

The principles of the four-point probe measurement are further explained in the following sections, which relate to bulk samples and thin films:

i. Bulk Samples

Assuming a metal tip is infinitely small, the differential resistant for bulk samples is represented by the following equation when the sample thickness (t) is much greater than the probe spacing (s):

$$\Delta R = \rho \left( \frac{dx}{A} \right)$$

wherein A is the cross-sectional area of the measured sample. The following equation represents the integration between the inner probe tips (where the voltage is measured):

$$R = \int_{x_1}^{x_2} \rho \frac{dx}{2\pi x^2} = \frac{\rho}{2\pi} \left( -\frac{1}{x} \right) \Big|_{x_1}^{x_2} = \frac{1}{2s} \frac{\rho}{2\pi}$$

Due to the superposition of current at the outer two tips, R=V/2I. Thus, the resistivity for the bulk sample is expressed by the following equation:

$$\rho = 2\pi s \left( \frac{V}{I} \right).$$

ii. Thin Sheet

For a thin film sample, (t<<s), the current field is a ring instead of a sphere. This cross-sectional area can be expressed as A=2nπxt, therefore:

$$R = \int_{x_1}^{x_2} \rho \frac{dx}{2\pi xt} = \int_{s}^{2s} \frac{\rho}{2\pi t} \frac{dx}{x} = \frac{\rho}{2\pi t} \ln(x) \Big|_{s}^{2s} = \frac{\rho}{2\pi t} \ln 2.$$

And the resistivity for the thin film sample is expressed by the following equation:

$$\rho = \frac{\pi t}{\ln 2} \left( \frac{V}{I} \right).$$

This method is one of free space measurement (wirelessly non-contact non-destructive measurement). The measurement system of this example also includes, in some instances, a vector network analyzer, a free space fixture (antennas, tunnels, arches, etc.), and measurement software.

This method uses antennas to focus microwave energy through a sheet of material, while the sample is not touched. The material sample is heated by placing it in a furnace, which has two opposite "windows" of insulation material that are transparent to microwaves.

The measurement of a material's dielectric property can depend on electromagnetic wave propagation. With a sinusoid wave input, electric fields and magnetic fields appear together. The electromagnetic wave propagates through free space at the speed of light c. But the propagation speed can be much lower if it goes through material. By changing the frequency of an electromagnetic wave, the wavelength of the signal will also change, as demonstrated by the following equation:

$$\lambda = \frac{c}{f},$$

wherein f is the frequency.

In such a case, wave propagation is dependent on the permittivity and permeability of a material. There are incident, reflected, and transmitted waves in a measurement system. Since the impedance of the wave in the material Z is lower from the free space impedance Z0, there is an impedance mismatch that creates the reflected wave. Part of the energy penetrates the sample.

Figure 2:
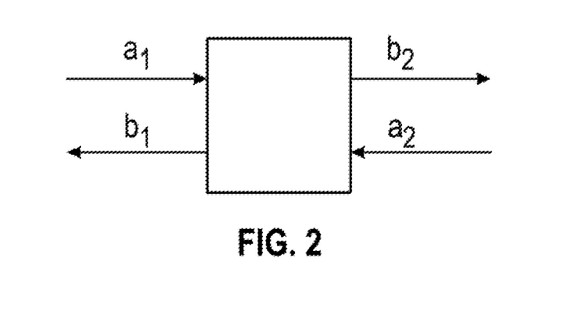
FIG. 2 depicts an embodiment of an S-parameter matrix for a 2-port network.

FIG. 2 depicts an S-parameter matrix for a 2-port network diagram. In this case, the relationship between the reflected, incident power waves and the S-parameter matrix is represented by the following equation:

$$\begin{pmatrix} b_1 \\ b_2 \end{pmatrix} = \begin{pmatrix} S_{11} & S_{12} \\ S_{21} & S_{22} \end{pmatrix} \begin{pmatrix} a_1 \\ a_2 \end{pmatrix}$$

wherein $a_1$ is the incident voltage wave, $b_1$ is the reflected voltage wave. It is reasonable to consider that the incident power wave at port 1 results in reflected power wave $b_1$ and output power wave $b_2$. The complex linear gain derived in the free-space measurement configuration is as follows:

$$S_{21} = \frac{b_2}{a_1},$$

which is exactly the ratio of output and input. The scalar logarithmic (decibel) is expressed as follows:

$$g = 20 \log_{10}|S_{21}|$$

The permittivity and permeability information can be extracted from a gain plot demonstrated by a network analyzer. In particular, it is helpful for defining a scattering parameter:

$$X = \frac{1 - V_1 V_2}{V_1 - V_2}$$

wherein:

$$V_1 = S_{11} + S_{21}, \text{ and}$$

$$V_2 = S_{21} - S_{11}.$$

As a result, the reflection coefficient, based on the following NRW algorithm:

$$\Gamma = X \pm \sqrt{X^2 - 1}.$$

According to the NRW algorithm procedure, the propagation coefficient is as follows:

$$P = \frac{V_1 - \Gamma}{1 - V_1 \Gamma}$$

In view of the following equation:

$$\frac{1}{\Lambda^2} = -\left(\frac{1}{2\pi L} \ln\left(\frac{1}{P}\right)\right)^2,$$

in which L is the thickness of the sample, it is possible to solve for the permeability:

$$\mu_r = \frac{1 + \Gamma}{(1 - \Gamma)\Lambda \sqrt{\frac{1}{\lambda_0^2} - \frac{1}{\lambda_r^2}}}$$

wherein $\lambda_0$ and $\lambda_r$ are the free space wavelength and the cutoff wavelength. The latter can be read a from network analyzer. The permittivity is calculated as follows:

$$\varepsilon_r = \frac{\lambda_0^2}{\mu_r}\left(\frac{1}{\lambda_r^2} - \left(\frac{1}{2\pi L}\ln\left(\frac{1}{P}\right)\right)^2\right)$$

The foregoing techniques may be used to study the electrical conductivity properties of the materials, especially in a high temperature area. The electromagnetic behaviors of UHTCs can be temperature dependent, which is an important consideration if they are to be applied in environments of varying temperature. The foregoing ultra-high temperature measurement system can measure the electrical conductivity of UHTCs up to 2500° C.

The invention claimed is:

1. A method of forming a composite material, the method comprising:
providing a mixture comprising (i) ultra-high temperature ceramic particles and (ii) a liquid preceramic precursor;
heating the mixture at a temperature for a time effective to cure the liquid preceramic precursor to form a solid mixture;
subjecting the solid mixture to one or more forces to form particles of the solid mixture; and
pressing the particles of the solid mixture into a mold having a pre-selected shape to form the composite material.

2. The method of claim 1, further comprising sintering the composite material.

3. The method of claim 1, wherein each of the particles of the solid mixture comprises (a) a core region comprising an amount of the ultra-high temperature ceramic particles, and (b) a surface region comprising an amount of the cured liquid preceramic precursor; and for each of the particles (i) the amount of the ultra-high temperature ceramic particles of the core region includes at least 75%, by weight, of the ultra-high temperature ceramic particles that are present in each particle, and (ii) the amount of the cured liquid preceramic precursor of the surface region includes at least 75%, by weight, of the cured ceramic precursor that is present in each particle.

4. The method of claim 1, wherein the subjecting of the solid mixture to one or more forces comprises compressing the solid mixture, grinding the solid mixture, or a combination thereof.

5. The method of claim 4, wherein the grinding of the solid mixture comprises ball milling the solid mixture.

6. The method of claim 1, wherein the ultra-high temperature ceramic particles have a melting temperature of at least 2,000° C.

7. The method of claim 6, wherein the ultra-high temperature ceramic particles have at least one of the following properties: [1] an elastic modulus of at least 500 GPa, [2] a hardness of at least 20 GPa, [3] an electrical conductivity of at least $10^7$ S/m, or [4] a thermal conductivity of about 60 to about 120 W/m*K.

8. The method of claim 1, wherein the ultra-high temperature ceramic particles are selected from the group consisting of a boride, a carbide, and a nitride.

9. The method of claim 1, wherein the ultra-high temperature ceramic particles comprise $HfB_2$, $ZrB_2$, $TiB_2$, $NbB_2$, $TaB_2$, or a combination thereof.

10. The method of claim 1, wherein the ultra-high temperature ceramic particles comprise TaC, HfC, ZrC, NbC, TiC, or a combination thereof.

11. The method of claim 1, wherein the ultra-high temperature ceramic particles comprise TaN, HfN, TiN, ZrN, NbN, or a combination thereof.

12. The method of claim 1, wherein the liquid preceramic precursor comprises an organosilicon polymer.

13. The method of claim 12, wherein the organosilicon polymer comprises polycarbosilane.

14. A method of forming a composite material, the method comprising:
providing a mixture comprising (i) ultra-high temperature ceramic particles and (ii) a liquid preceramic precursor, wherein the ultra-high temperature ceramic particles comprise a nitride, a boride, a carbide, or a combination thereof having a melting temperature of at least 2,000° C.;

heating the mixture at a temperature for a time effective to cure the liquid preceramic precursor to form a solid mixture;

subjecting the solid mixture to one or more forces to form particles of the solid mixture, wherein each of the particles of the solid mixture comprises (a) a core region comprising an amount of the ultra-high temperature ceramic particles, and (b) a surface region comprising an amount of the cured liquid preceramic precursor; and for each of the particles (i) the amount of the ultra-high temperature ceramic particles of the core region includes at least 75%, by weight, of the ultra-high temperature ceramic particles that are present in each particle, and (ii) the amount of the cured liquid preceramic precursor of the surface region includes at least 75%, by weight, of the cured ceramic precursor that is present in each particle;

pressing the particles of the solid mixture into a mold having a pre-selected shape to form the composite material; and sintering the composite material.

15. The method of claim 14, wherein the liquid preceramic precursor comprises an organosilicon polymer.

* * * * *